(12) United States Patent
Pei

(10) Patent No.: US 8,635,970 B2
(45) Date of Patent: Jan. 28, 2014

(54) MASK FOR USE IN EVAPORATION COATING PROCESS

(75) Inventor: Shao-Kai Pei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 61 days.

(21) Appl. No.: 13/340,600

(22) Filed: Dec. 29, 2011

(65) Prior Publication Data

US 2013/0112139 A1    May 9, 2013

(30) Foreign Application Priority Data

Nov. 4, 2011  (TW) .............................. 100140261 A

(51) Int. Cl.
*B05C 11/11*   (2006.01)
*B05D 5/00*    (2006.01)

(52) U.S. Cl.
USPC .......................................... 118/504; 427/256

(58) Field of Classification Search
None
See application file for complete search history.

(56) References Cited

U.S. PATENT DOCUMENTS

| | | | | |
|---|---|---|---|---|
| 5,660,220 A | * | 8/1997 | Ruan | 160/84.07 |
| 7,508,657 B1 | * | 3/2009 | Smith | 361/679.27 |
| 2003/0006015 A1 | * | 1/2003 | Lin | 160/370.23 |

* cited by examiner

*Primary Examiner* — Dah-Wei Yuan
*Assistant Examiner* — Charles Capozzi
(74) *Attorney, Agent, or Firm* — Altis Law Group, Inc.

(57) ABSTRACT

A mask includes a base board, a number of wing boards, and aluminum foil. The wing boards are detachably attached to the base board in pairs, in a certain disposition and order and are rotatable relative to the base board in a substantially coplanar manner. The aluminum foil wraps around the base board and the wing boards so as to achieve a contour that is cooperatively defined by the base board and the wing boards.

6 Claims, 7 Drawing Sheets

MASK FOR USE IN EVAPORATION COATING PROCESS

BACKGROUND

1. Technical Field

The present disclosure relates to devices used in evaporation coating processes and, particularly, to a mask for use in an evaporation coating process.

2. Description of Related Art

In evaporation coating processes, workpieces near the source material may capture more evaporant than those far from the source material as evaporant near the source material will be thicker than that far from the source material. As a result, coating uniformity is not achieved. To solve the problem, a mask is employed to shield a part of the workpiece near the source material while not shielding more distant parts, to increase the coating uniformity. Such a mask may include a base wrapped with aluminum foil. The shape of the mask is fixed by the shape of the base, and cannot be changed when coating requirements are changed.

Therefore, it is desired to provide a mask for use in evaporative coatings, which can overcome the above-mentioned problem.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
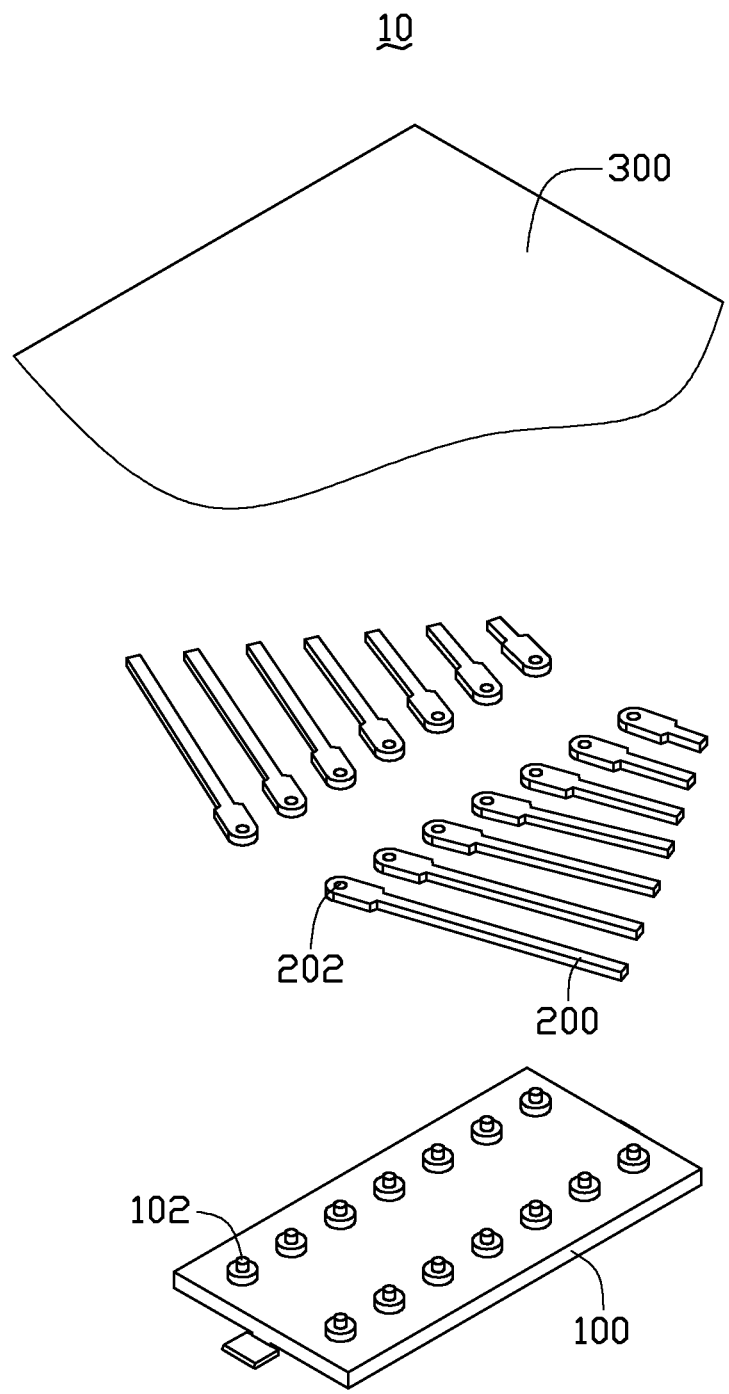
FIG. 1 is an isometric, exploded, schematic view of a mask, according to a first embodiment.
Figure 2:
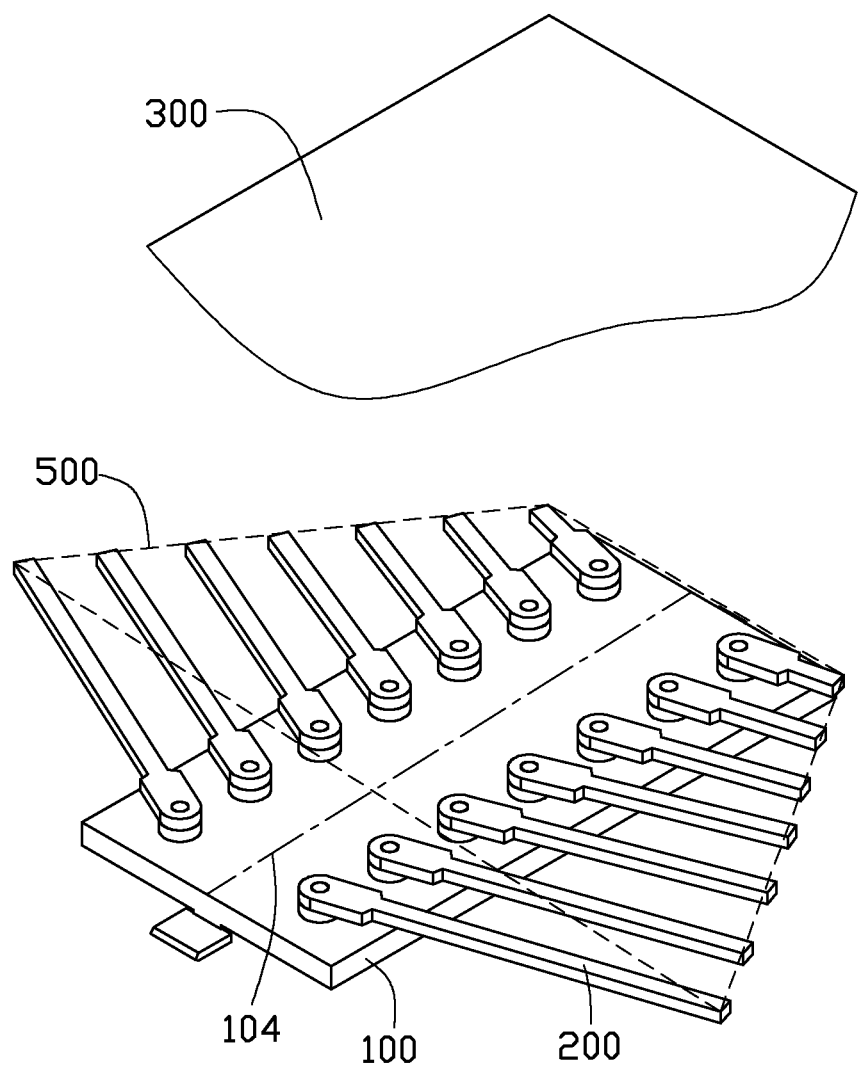
FIG. 2 is an isometric, partially-assembled, schematic view of the mask of FIG. 1.
Figure 3:
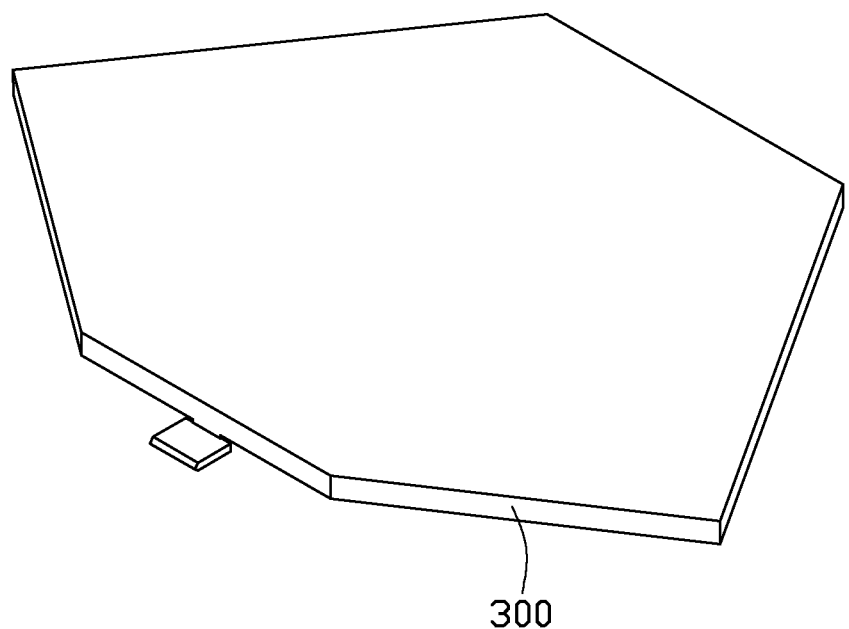
FIG. 3 is an isometric schematic view of the mask of FIG. 1.
Figure 4:
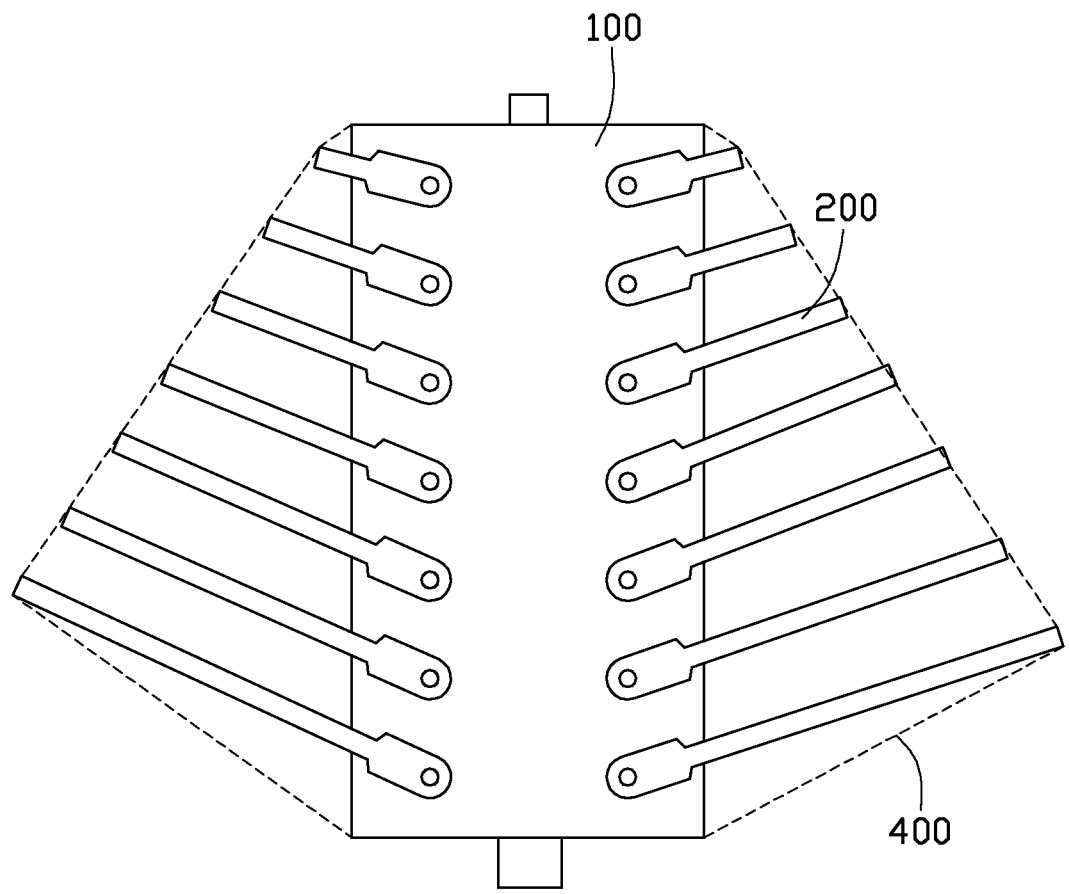
FIG. 4 is a planar schematic view of the mask of FIG. 1.

Embodiments of the present disclosure will now be described in detail with reference to the drawings.

Referring to FIGS. 1-4, a mask 10 for use in evaporation coating processes, according to a first embodiment, includes a base board 100, a number of wing boards 200, and an aluminum foil 300. The wing boards 200 are detachably attached to the base board 100 and rotatable in a same plane 500 that is substantially coplanar with the base board 100. The aluminum foil 30 wraps around the base board 100 and the wing boards 200 along a contour 400 cooperatively defined by the base board 100 and the wing boards 200.

The mask 10 can be assembled by the steps S01-S05.

In step S01 the base board 100 and a number of wing boards 200, and the aluminum foil 300 are provided. The base board 100 is rectangular and includes a number of attachable portions 102 arranged in two parallel lines along the two long sides of the base board 100. The lengths of the wing boards 200 are variable, and each of the wing boards 200 has an attaching portion 202 at one end thereof.

Figure 5:
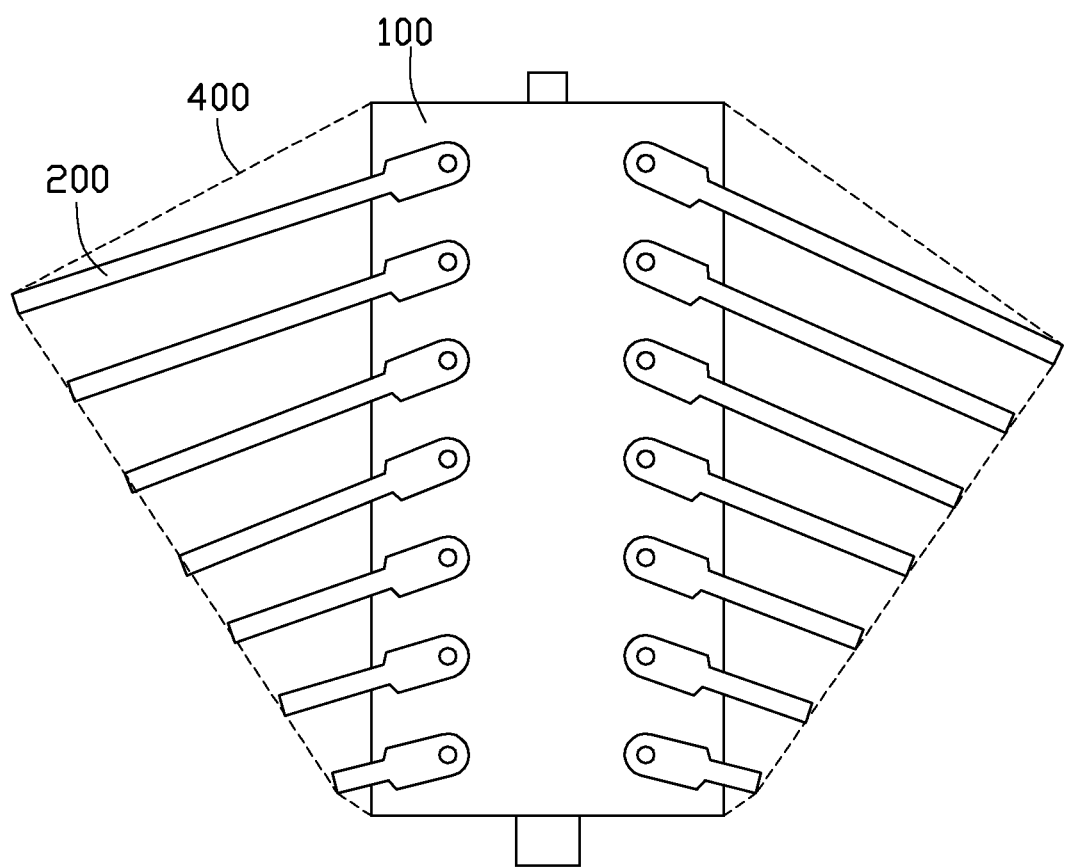
FIG. 5 is a planar schematic view of a mask, according to a second embodiment.
Figure 6:
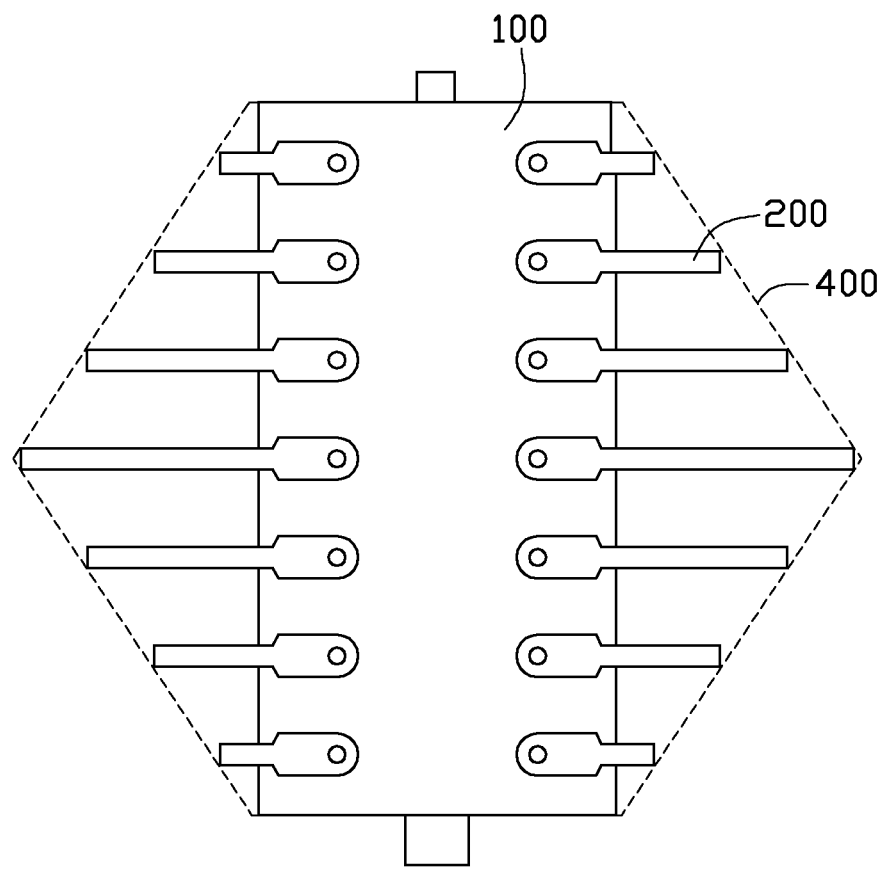
FIG. 6 is a planar schematic view of a mask, according to a third embodiment.

In step S02, a selection is made concerning length within all the wing boards 200 coupled with (in step S03) a selection as to the placement of the chosen wing boards 200 on the attachable portions 102, depending on coating requirements and the size and shape of the mask required. In the first embodiments of FIGS. 1-4, a second embodiment of FIG. 5 and a third embodiment of FIG. 6, all the wing boards 200 are selected. Also, in these embodiments, the total number of the wing boards 200 may be greater than fourteen, however, fourteen of the wing boards 200 as shown in FIGS. 1-4 are selected in the embodiment of FIGS. 1-5 and another fourteen of the wing boards 200 as shown in FIG. 6 are selected in the embodiment of FIG. 6. In a fourth embodiment of FIG. 7, only six of the wing boards 200 are selected.

In step S03, a number of the attachable portions 102 are selected from all the attachable portions 102 depending on the coating requirements and the size and shape of the mask required. For example, in the embodiments of FIGS. 1-6, the number of the attachable portions 102 required to be utilized is fourteen. In the fourth embodiment of FIG. 7, the number is six.

Figure 7:
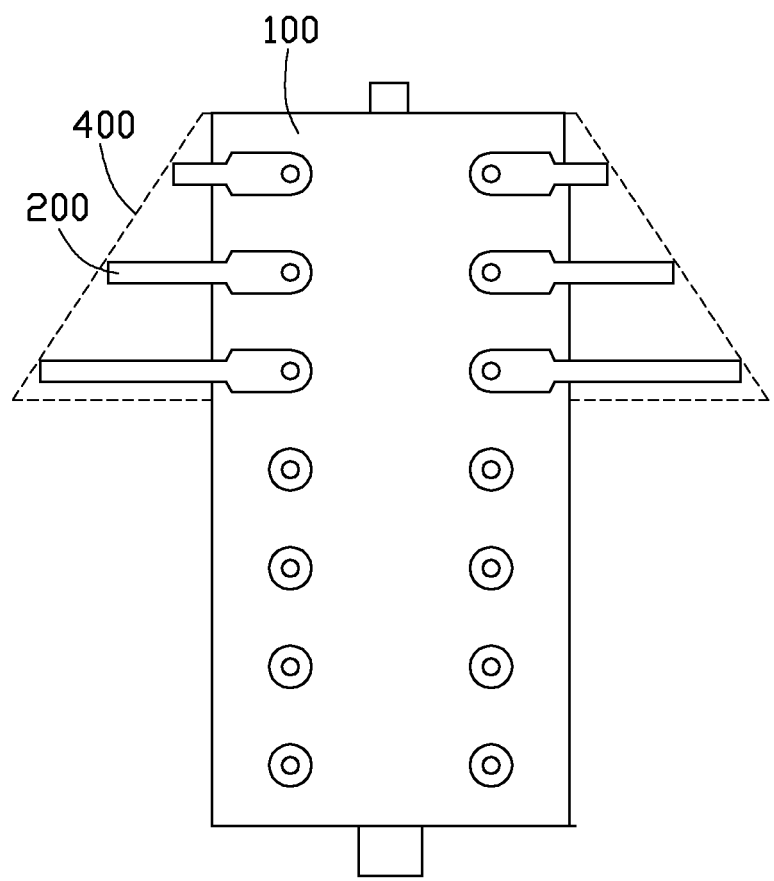
FIG. 7 is a planar schematic view of a mask, according to a fourth embodiment.

In step S04, the chosen wing boards 200 are detachably attached to the chosen attachable portions 102 by engagements between the attachable portions 102 and the attaching portions 202 such that the chosen wing boards 200 can be rotated in the plane 500. An arrangement or disposition of the chosen wing boards 200 can be set depending on the coating requirements and the size and shape of the mask required. For example, the same fourteen of the wing boards 200 can be attached to the base board 100 in the different configurations as shown in FIGS. 1-4 or FIG. 5. The chosen wing boards 200 can be rotated relative to the base board 100 to change the contour 400 as needed. For example, the first number of wing boards 200 can be rotated to form an angle with the base board 100 as shown in FIGS. 1-5 or to form another angle as shown in FIGS. 6-7.

The attachable portions 102 and the wing boards 200 are symmetrically arranged about the lengthways center line 104 of the base board 100 and are thus arranged in pairs. The two wing boards 200 in each pair are substantially identical. There is a consistent difference in length between adjacent pairs of wing boards 200 so as to achieve a smooth and substantially straight line over the distal ends of the wing boards 200 of each side of the base board 100.

Each attachable portion 102 is a rod and each attaching portion 202 is a hole. Each attachable portion 102 fits into the hole of each attaching portion 202 such that each wing board 100 is kept stable and in one position when wrapping the aluminum foil 300 around the wing boards 200 while can be rotated or detached by exerting a force thereto.

In step S05, the aluminum foil 300 wraps around the base board 100 and the wing boards 200 along the contour 400 cooperatively defined by the base board 100 and the chosen wing boards.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. An evaporation coating mask, comprising:
a base board comprising a plurality of attachable portions arranged in two parallel lines along two long sides of the base board;
a plurality of wing boards detachably attached to the base board and rotatable relative to the base board in a same plane that is coplanar with the base board; each wing board having an attaching portion at an end thereof, each attaching portion engaged with a respective one of the attachable portions, the number of the wing boards along each of the two parallel lines being more than two; and
an aluminum foil wrapping around the base board and the wing board along a contour that is cooperatively defined by the base board and the wing boards.

2. The mask of claim 1, wherein the base board is rectangular the lengths of the wing boards are different from each other.

3. The mask of claim 2, wherein each attachable portion is a rod, each attaching portion is a hole, and each rod is received in a respective hole.

4. The mask of claim 3, wherein each attachable portion fits into a corresponding attaching portion to keep each wing board stable in one position while each wing board is rotatable and detachable by exerting a force.

5. The mask of claim 2, wherein the attachable portions and the wing boards are symmetrically arranged about a lengthways center line of the base board and are thus arranged in pairs, the two wing boards in each pair are substantially identical in length, there is a consistent difference in length between adjacent pairs of wing boards.

6. The mask of claim 2, wherein an arrangement of the wing boards is changeable by interchanging the wing boards among the attachable portions.

* * * * *